(12) United States Patent
Lai et al.

(10) Patent No.: US 8,058,692 B2
(45) Date of Patent: Nov. 15, 2011

(54) MULTIPLE-GATE TRANSISTORS WITH REVERSE T-SHAPED FINS

(75) Inventors: Li-Shyue Lai, Jhube (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 257 days.

(21) Appl. No.: 12/345,332

(22) Filed: Dec. 29, 2008

(65) Prior Publication Data
US 2010/0163842 A1 Jul. 1, 2010

(51) Int. Cl.
*H01L 29/786* (2006.01)

(52) U.S. Cl. ............... 257/374; 257/401; 257/E29.052; 257/E29.104

(58) Field of Classification Search ............... 257/374, 257/401, E29.052, E29.104
See application file for complete search history.

(56) References Cited

U.S. PATENT DOCUMENTS

| | | | |
|---|---|---|---|
| 6,706,571 B1 | 3/2004 | Yu et al. |
| 6,858,478 B2 | 2/2005 | Chau et al. |
| 7,190,050 B2 | 3/2007 | King et al. |
| 7,198,995 B2 | 4/2007 | Chidambarrao et al. |
| 7,247,887 B2 | 7/2007 | King et al. |
| 7,265,008 B2 | 9/2007 | King et al. |
| 7,326,634 B2 | 2/2008 | Lindert et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0290470 A1 | 11/2008 | King et al. |
| 2008/0296632 A1 | 12/2008 | Moroz et al. |
| 2009/0001464 A1* | 1/2009 | Booth et al. ............ 257/347 |
| 2009/0181477 A1 | 7/2009 | King et al. |

FOREIGN PATENT DOCUMENTS

CN  1667794 A  9/2005

OTHER PUBLICATIONS

Feng, J., et al., "P-Channel Germanium FinFET Based on Rapid Melt Growth," IEEE Electron Device Letters, vol. 28, No. 7, Jul. 2007, pp. 637-639.

Fukuda, Y., et al., "Critical Thickness for the $Si_{1-x}Ge_x$/Si Heterostructure," Japanese Journal of Applied Physics, vol. 29, No. 1, Jan. 1990, pp. L 20-L 22.

(Continued)

*Primary Examiner* — Minh-Loan Tran

(74) *Attorney, Agent, or Firm* — Slater & Matsil, L.L.P.

(57) ABSTRACT

A method of forming an integrated circuit structure includes forming a first insulation region and a second insulation region in a semiconductor substrate and facing each other; and forming an epitaxial semiconductor region having a reversed T-shape. The epitaxial semiconductor region includes a horizontal plate including a bottom portion between and adjoining the first insulation region and the second insulation region, and a fin over and adjoining the horizontal plate. The bottom of the horizontal plate contacts the semiconductor substrate. The method further includes forming a gate dielectric on a top surface and at least top portions of sidewalls of the fin; and forming a gate electrode over the gate dielectric.

19 Claims, 12 Drawing Sheets

OTHER PUBLICATIONS

Liang, Y., et al., "Critical Thickness Enhancement of Epitaxial SiGe Films Grown on Small Structures," Journal of Applied Physics, vol. 97, 2005, pp. 043519-1-043519-7.

Tezuka, T., et al., "Ultrathin Body SiGe-on-Insulator pMOSFETs with High-Mobility SiGe Surface Channels," IEEE Transactions on Electron Devices, vol. 50, No. 5, May 2003, pp. 1328-1333.

Vescan, L., et al., "Strained $Si_{1-x}Ge_x$/Si Dots and Wires Grown by Selective Epitaxy," Journal de Physique IV, Colloque C5, supplement au Journal de Physique II, vol. 5, Jun. 1995, pp. C5-55-C5-62.

Wang, G., et al., "Selective Epitaxial Growth of Germanium on Si Wafers with Shallow Trench Isolation: An Approach for Ge Virtual Substrates," Report to IMEC Industrial Affiliation Program, date unknown, 8 pages.

Yu, G., et al., "Characterization of Excimer Laser Annealed Polycrystalline $Si_{1-x}Ge_x$ Alloy Thin Films by X-Ray Diffraction and Spectroscopic Ellipsometry," Journal of Applied Physics, vol. 83, No. 1, Jan. 1, 1998, pp. 174-180.

\* cited by examiner

US 8,058,692 B2

MULTIPLE-GATE TRANSISTORS WITH REVERSE T-SHAPED FINS

TECHNICAL FIELD

This invention relates generally to semiconductor devices, and particularly to structures and formation methods of Fin field-effect transistors (FinFET) having germanium-containing fins.

BACKGROUND

Fin field-effect transistors (FinFET) are promising devices in small-scale integrated circuits, such as 22 nm technology and below, for their high drive currents and low chip-area usage. To further improve the drive currents of FinFETs, semiconductor materials having high electron mobility and hole mobility may be used in FinFET structures.

Germanium is a commonly known semiconductor material. The electron mobility and hole mobility of germanium are greater than that of silicon, hence making germanium an excellent material in the formation of integrated circuits. However, in the past, silicon gained more popularity since its oxide (silicon oxide) is readily usable in the gate dielectric of metal-oxide-semiconductor (MOS) transistors. The gate dielectrics of the MOS transistors can be conveniently formed by thermal oxidation of silicon substrates. The oxide of germanium, on the other hand, is soluble in water, and hence is not suitable for the formation of gate dielectrics.

With the use of high-k dielectric materials in the gate dielectrics of MOS transistors, the convenience provided by the silicon oxide is no longer a big advantage, and hence germanium is reexamined for the use in integrated circuits. Recent studies of germanium focusing on germanium nanowires, which are used in FinFETs, have been reported.

A challenge faced by the semiconductor industry is that it is difficult to form germanium films with high germanium concentrations or pure germanium films. Particularly, it is difficult to form high-concentration germanium films with low defect densities and great thicknesses, which germanium films are required for forming FinFETs. Previous research has revealed that when a silicon germanium film is epitaxially grown from a blanket silicon wafer, the critical thickness of the silicon germanium film reduces with the increase in the percentage of germanium in the silicon germanium film, wherein the critical thickness is the maximum thickness the silicon germanium film can reach without causing excess defects. For example, when formed on blanket silicon wafers, the critical thickness of a silicon germanium film having a 20% germanium percentage may be about 10 nm to about 20 nm, which thickness is still not adequate for forming FinFETs. To make things worse, when the germanium percentage increases to 40, 60, and 80%, the critical thicknesses are reduced to about 6-8 nm, 4-5 nm, and 2-3 nm, respectively. Accordingly, it is not feasible to form germanium films on blanket silicon wafers for the purpose of forming FinFETs.

SUMMARY OF THE INVENTION

In accordance with one aspect of the present invention, in a method of forming an integrated circuit structure, a first insulation region and a second insulation region are formed in a semiconductor substrate and facing each other. An epitaxial semiconductor region having a reversed T-shape is then formed. The epitaxial semiconductor region includes a horizontal plate, including a bottom portion between and adjoining the first insulation region and the second insulation region, and a fin over and adjoining the horizontal plate. The bottom of the horizontal plate contacts the semiconductor substrate. The method further includes forming a gate dielectric on a top surface and at least top portions of sidewalls of the fin, and forming a gate electrode over the gate dielectric. Other embodiments are also disclosed.

The advantageous features of the present invention include high drive currents of FinFETs due to the fact that the resulting FinFETs may have high germanium percentages and reduced defects in germanium films. Further, the pitches for forming STI regions, which are used for forming germanium-containing fins, are also relaxed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention and do not limit the scope of the invention.

An integrated circuit formation process including the formation of a germanium region having a reversed T-shape, which may be used to form a fin field-effect transistor (FinFET) (also referred to as a multi-gate transistor), is provided. The intermediate stages of manufacturing an embodiment of the present invention are illustrated. The variations of the embodiment are discussed. Throughout the various views and illustrative embodiments of the present invention, like reference numbers are used to designate like elements.

Figure 1:
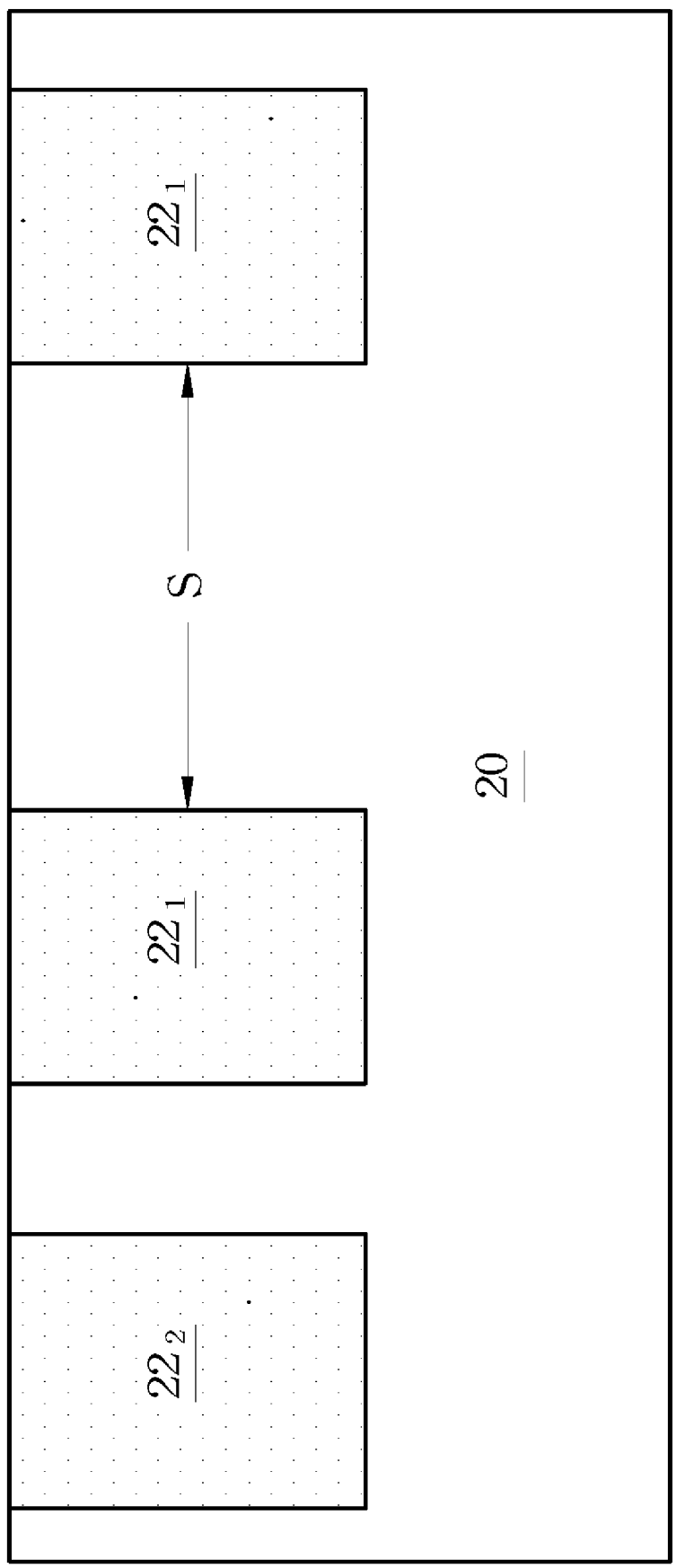
FIGS. 1 through 12 are cross-sectional views of intermediate stages in the formation of embodiments of the present invention.

Referring to FIG. 1, semiconductor substrate 20 is provided. In an embodiment, semiconductor substrate 20 is a bulk silicon substrate (and hence is referred to as silicon substrate 20 hereinafter) comprising substantially pure silicon, although other semiconductor materials may also be used. Shallow trench isolation (STI) regions 22 (denoted as $22_1$ and $22_2$, also referred to as insulation regions) are formed in silicon substrate 20. The formation process of STI regions 22 is known in the art and hence is not repeated herein. The spacing S between neighboring STI regions $22_1$ may be less than about 100 µm, although it may be greater. One skilled in the art will realize, however, that the dimensions recited throughout the description are merely examples, and will change if different formation technologies are used.

Figure 2:
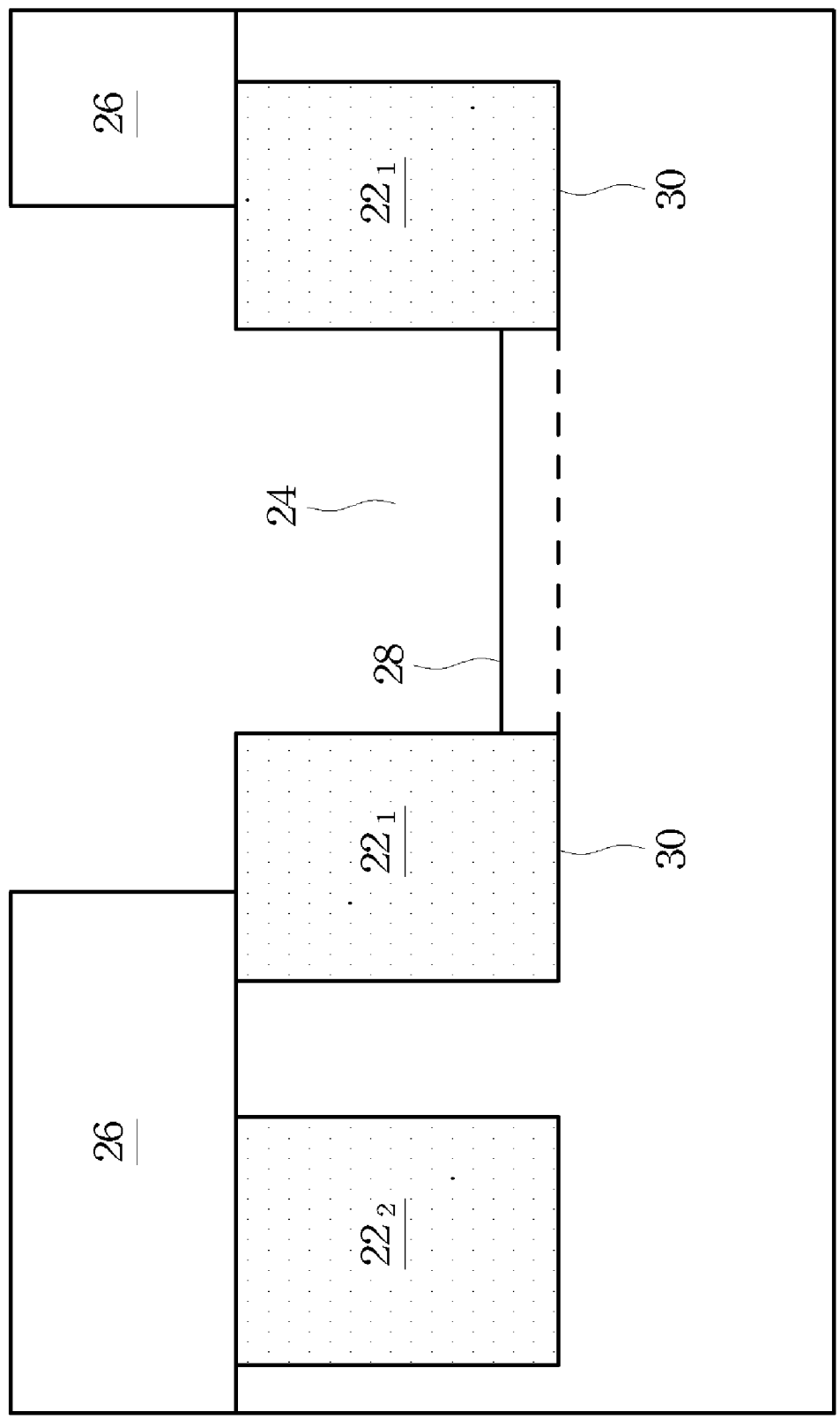

Referring to FIG. 2, a portion of silicon substrate 20 between STI regions $22_1$ is etched to form recess 24. Other portions of silicon substrate may be masked using mask 26 when the etching is performed. In an embodiment, recess 24 has bottom 28 higher than bottoms 30 of STI regions 22. In alternative embodiments, bottom 28 is substantially level with bottoms 30, as is shown by the dotted line. Bottom 28 of recess 24, however, may be no lower than bottoms 30.

Figure 3:
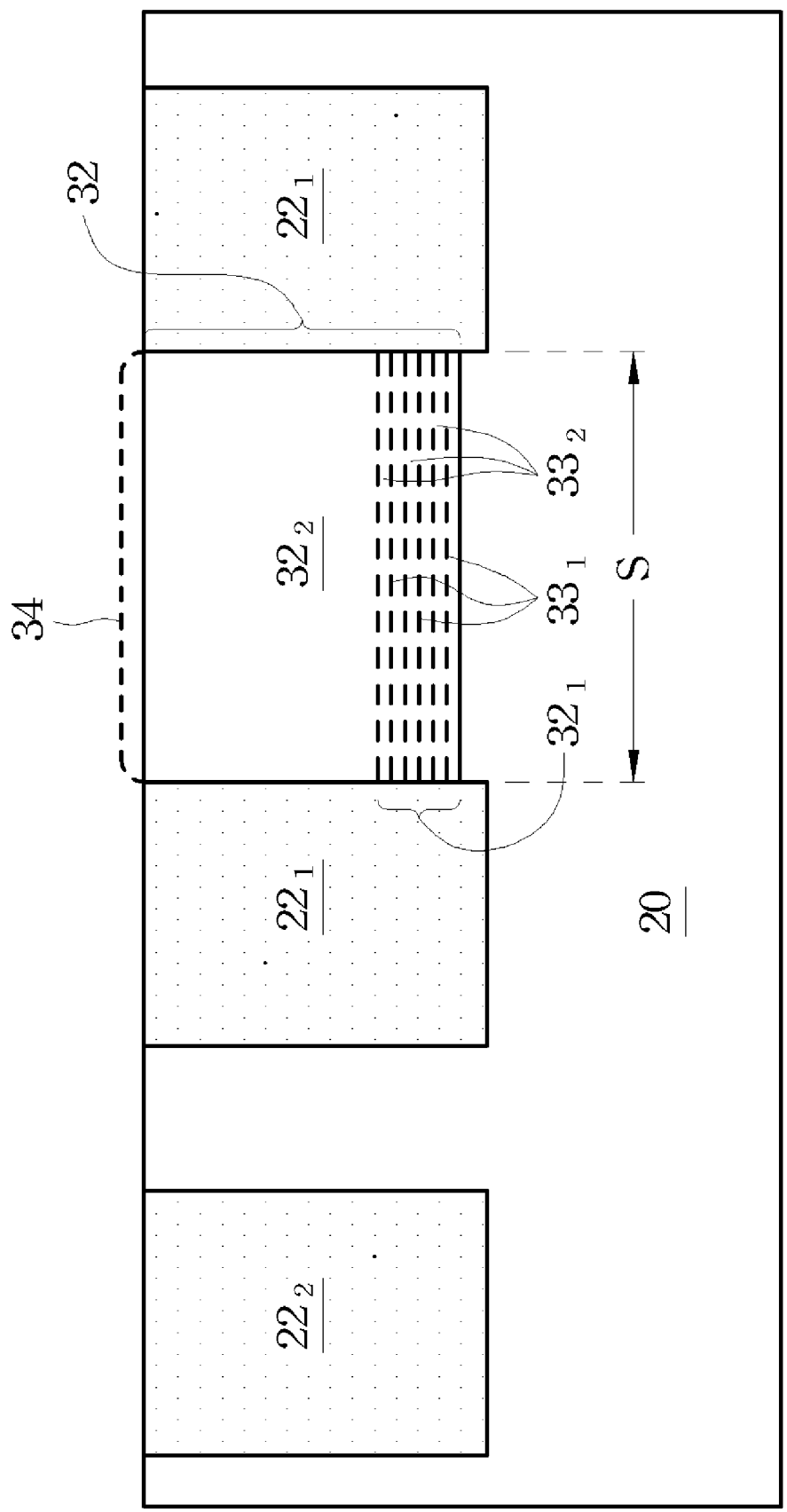

Next, as shown in FIG. 3, germanium-containing region 32 is epitaxially grown in recess 24. Germanium-containing region 32 may include silicon germanium, which may be expressed as $Si_{1-x}Ge_x$, wherein x is the atomic percentage of germanium and may be in the range greater than 0 and equal to or less than 1. In an embodiment, germanium-containing region 32 comprises substantially pure germanium (with x equal to 1).

In alternative embodiments, germanium-containing region 32 includes lower portion $32_1$ and upper portion $32_2$ having different germanium percentages, wherein upper portion $32_2$ may have a higher germanium percentage than lower portion $32_1$. In this case, upper portion $32_2$ may be formed of substantially pure germanium. Advantageously, lower portion $32_1$ that has the lower germanium percentage may be used as a buffer layer for the upper portion that has the higher germanium percentage. In yet other embodiments, germanium-containing region 32 may include a region in which the germanium percentage gradually and continuously transitions from lower values to higher values. In yet other embodiments, upper portion $32_2$ may include substantially pure germanium, while lower portion $32_1$ may include a superlattice structure including multiple SiGe layers $33_1$ and multiple substantially pure germanium layers $33_2$ arranged layer by layer in an alternating pattern. In yet other embodiments, an entirety of germanium-containing region 32 has the superlattice structure.

Germanium-containing region 32 may be grown to a level higher than the top surface of STI regions 22, followed by a chemical mechanical polish (CMP) to level the top surface of STI regions 22 and germanium-containing region 32. In alternative embodiment, no CMP is performed. An exemplary top surface of germanium-containing region 32 without being polished is shown with dotted line 34.

Advantageously, by growing germanium-containing region 32 between STI regions $22_1$, the number of defects (dislocations) can be significantly lower than in the germanium-containing films epitaxially grown from blanket wafers, sometimes by two orders or more. Further, spacing S between neighboring STI regions $22_1$ may be as big as a couple of hundred nanometers, while the respective critical thickness of the germanium-containing layers is still greater than about 100 nm or significantly greater. Therefore, STI regions $22_1$ may have relaxed pitches without causing the critical thickness of the germanium-containing layers to be too small. Such a great critical thickness is adequate for forming the fins of FinFETs.

Figure 4:
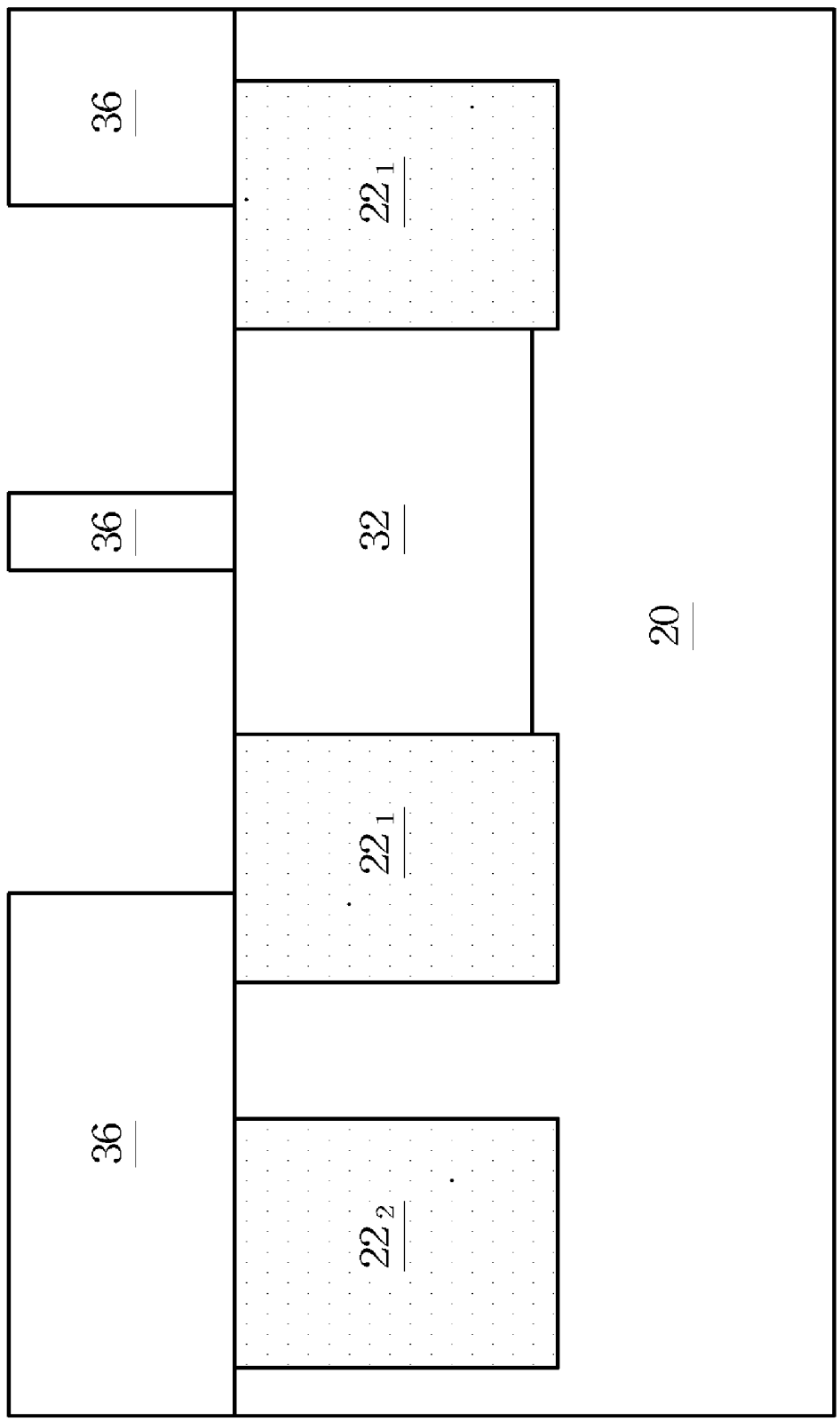

Referring to FIG. 4, hard masks 36 (or photo resist) are formed, for example, using silicon nitride. Hard masks 36 include a portion directly over germanium-containing region 32. In an embodiment, hard masks 36 may include portions covering exposed substrate 20 and STI region $22_2$, so that in subsequent etching of STI regions $22_1$, STI region $22_2$ and some portions of silicon substrate 20 are not etched. Alternatively, only the portions of germanium-containing region 32 that will form the future fins are covered, while all other regions of the respective wafer are exposed, including all of the illustrated STI regions $22_1$ and $22_2$.

Figure 5:
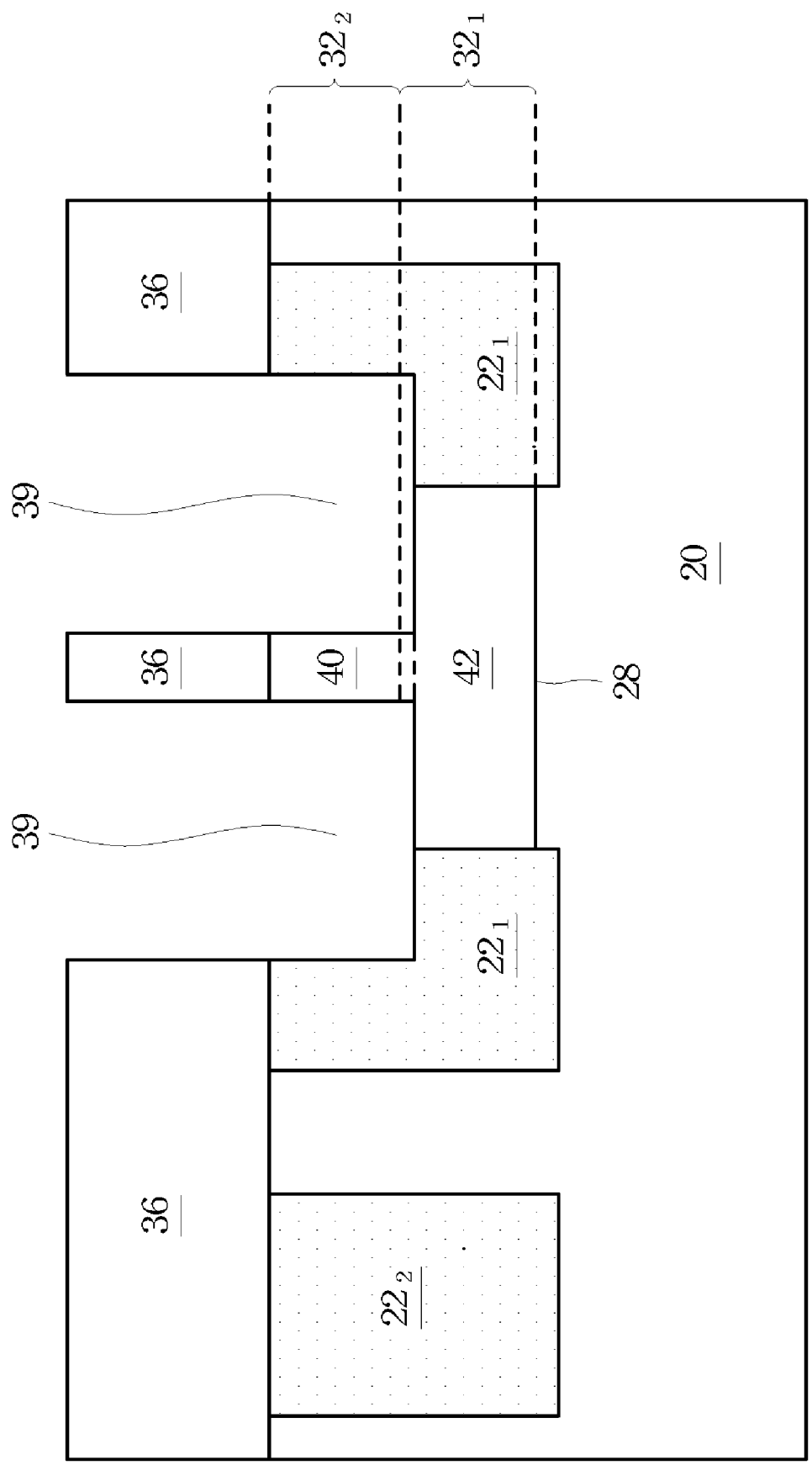

FIG. 5 illustrates the etching of germanium-containing region 32 and STI regions $22_1$. A dry etching may be performed using an etchant attacking both STI regions 22 and germanium-containing region 32, so that both are recessed. The bottoms of recesses 39 are higher than bottom surface 28 of germanium-containing region 32. In the resulting structure, the remaining portion of germanium-containing region 32 has a reversed T-shape (in a cross-sectional view) including a vertical portion (also referred to as germanium-containing fin 40) and horizontal plate 42. In the embodiments in which germanium-containing region 32 includes substantially pure germanium upper portion $32_2$ and lower portion $32_1$ includes silicon germanium or a superlattice structure, the bottoms of recesses 39 are substantially level with, or lower than the top surface of lower portion $32_1$, so that fin 40 consists of substantially pure germanium. Accordingly, the silicon germanium portion or the superlattice structure may be in horizontal plate 42. Alternatively, horizontal plate 42 may include substantially pure germanium. In other embodiments, both fin 40 and horizontal plate 42 are formed of silicon germanium.

Figure 6:
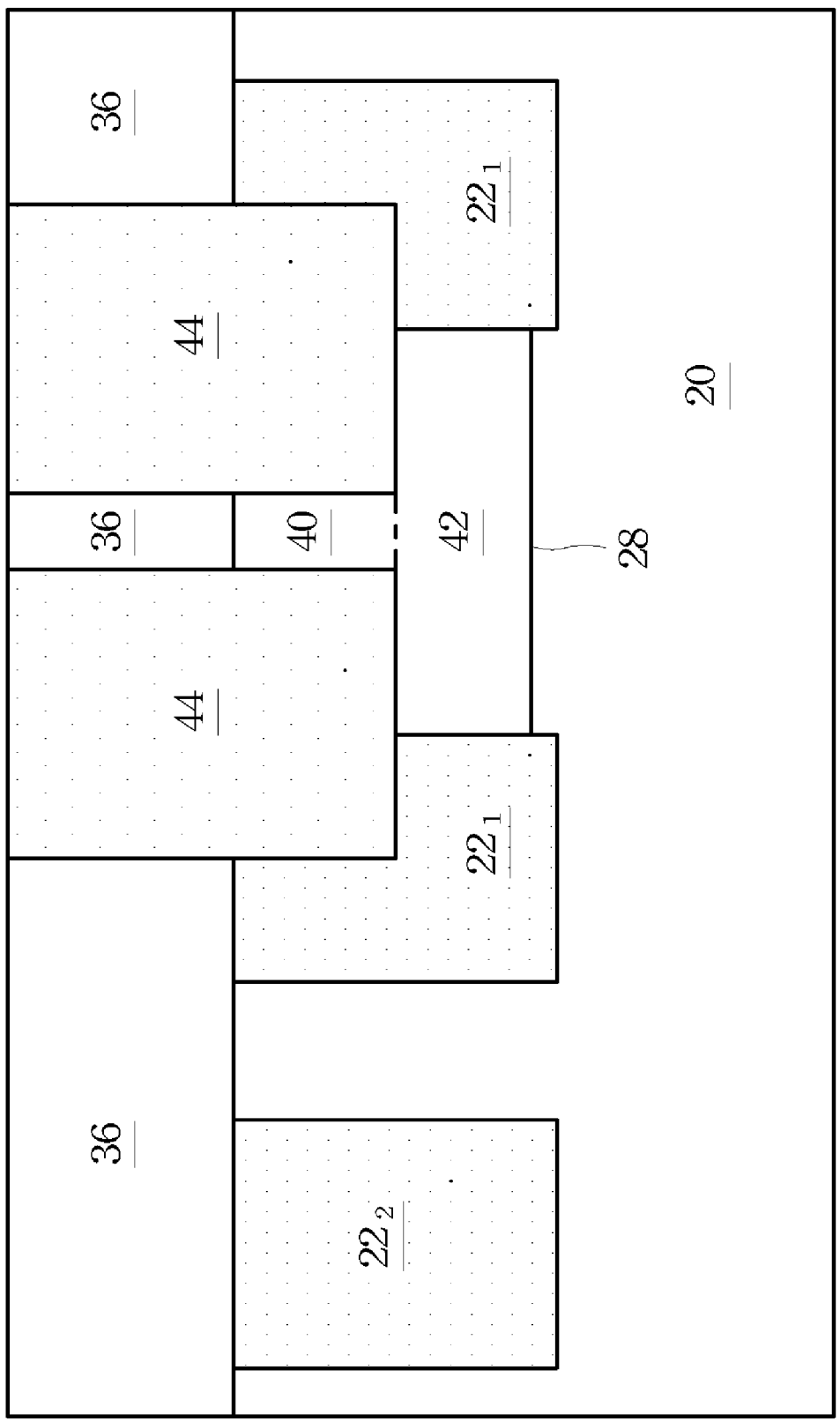

Next, as shown in FIG. 6, recesses 39 are filled with dielectric material 44, for example, silicon oxide formed by sub-atmospheric chemical vapor deposition (SA-CVD). In other embodiments, dielectric material 44 is formed by high-density plasma chemical vapor deposition (HDP-CVD) or spin on glass (SOG). A CMP is then performed to planarize the surface of the wafer and removes excess dielectric material 44. Hard masks 36 may be used as a CMP stop layer during the CMP.

Figure 7:
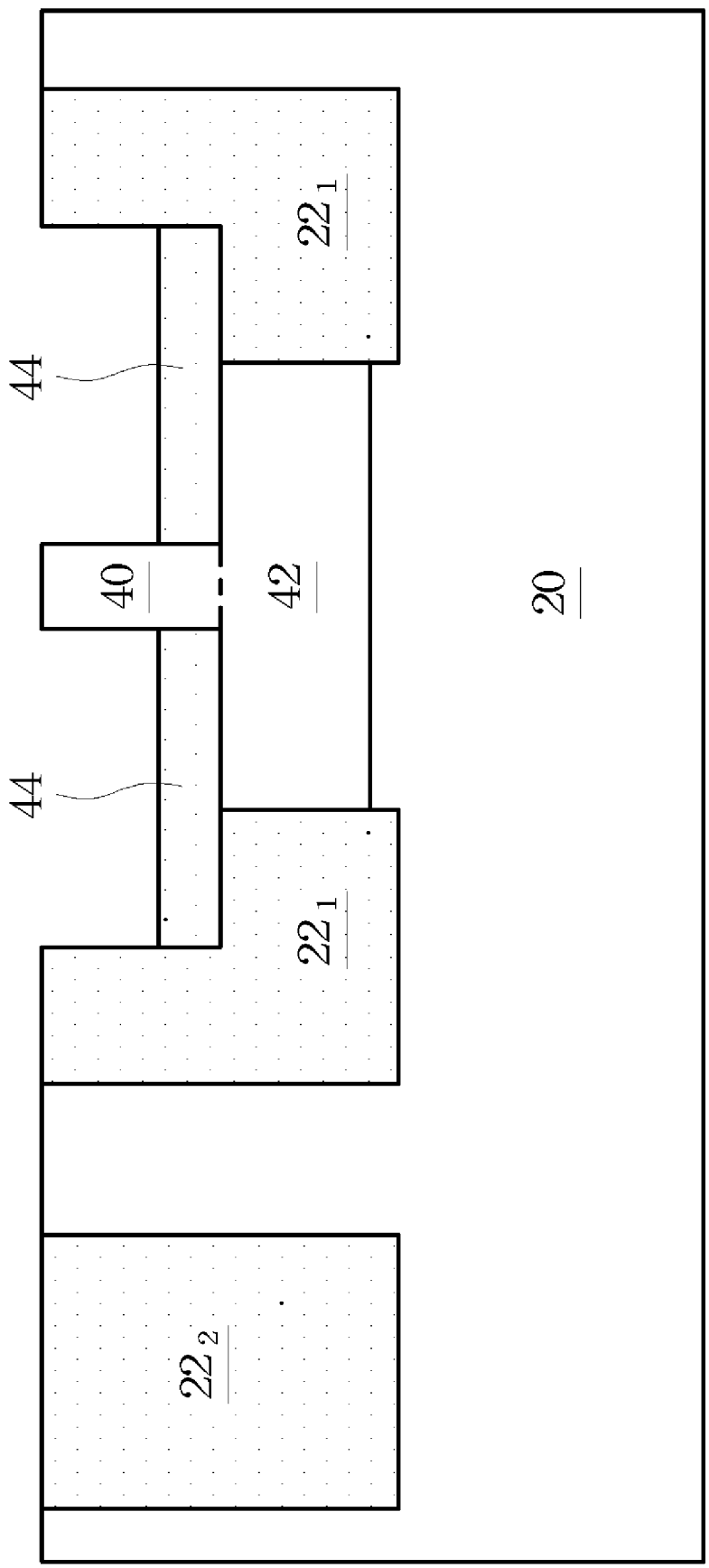
Figure 8:
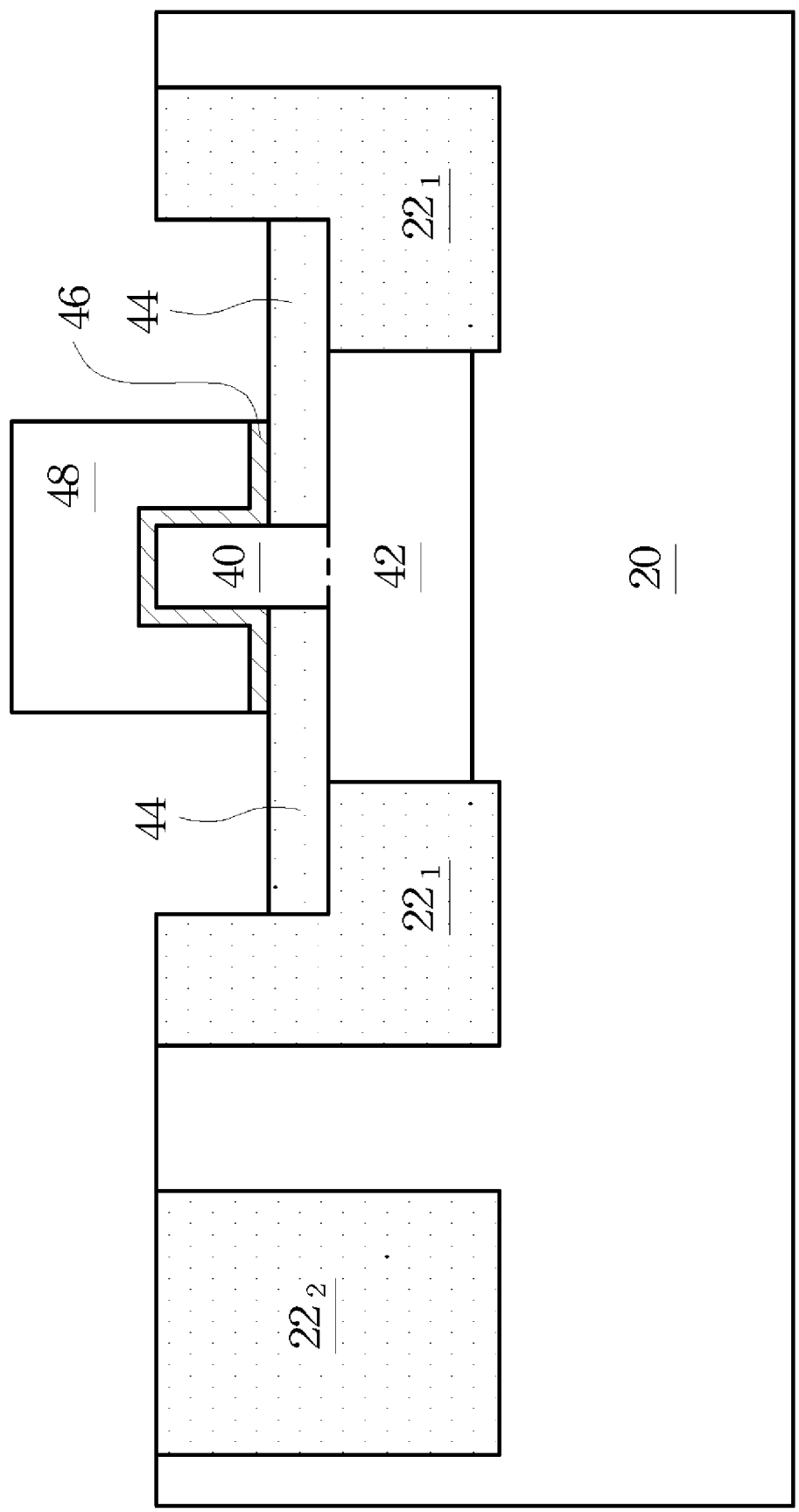

Referring to FIG. 7, dielectric material 44 is recessed. A layer of dielectric material 44 may be left un-removed, so that horizontal plate 42 is covered by the remaining dielectric material 44. Only a top portion of fin 40 stands above dielectric material 44 and may be used to form a FinFET. FIG. 8 illustrates gate dielectric 46 and gate electrode 48 of the FinFET. The materials and the formation details of gate dielectric 46 and gate electrode 48 are known in the art, and hence are not repeated herein. Advantageously, by covering horizontal plate 42 with a dielectric material, the leakage current of the resulting FinFET may be reduced.

Figure 9:
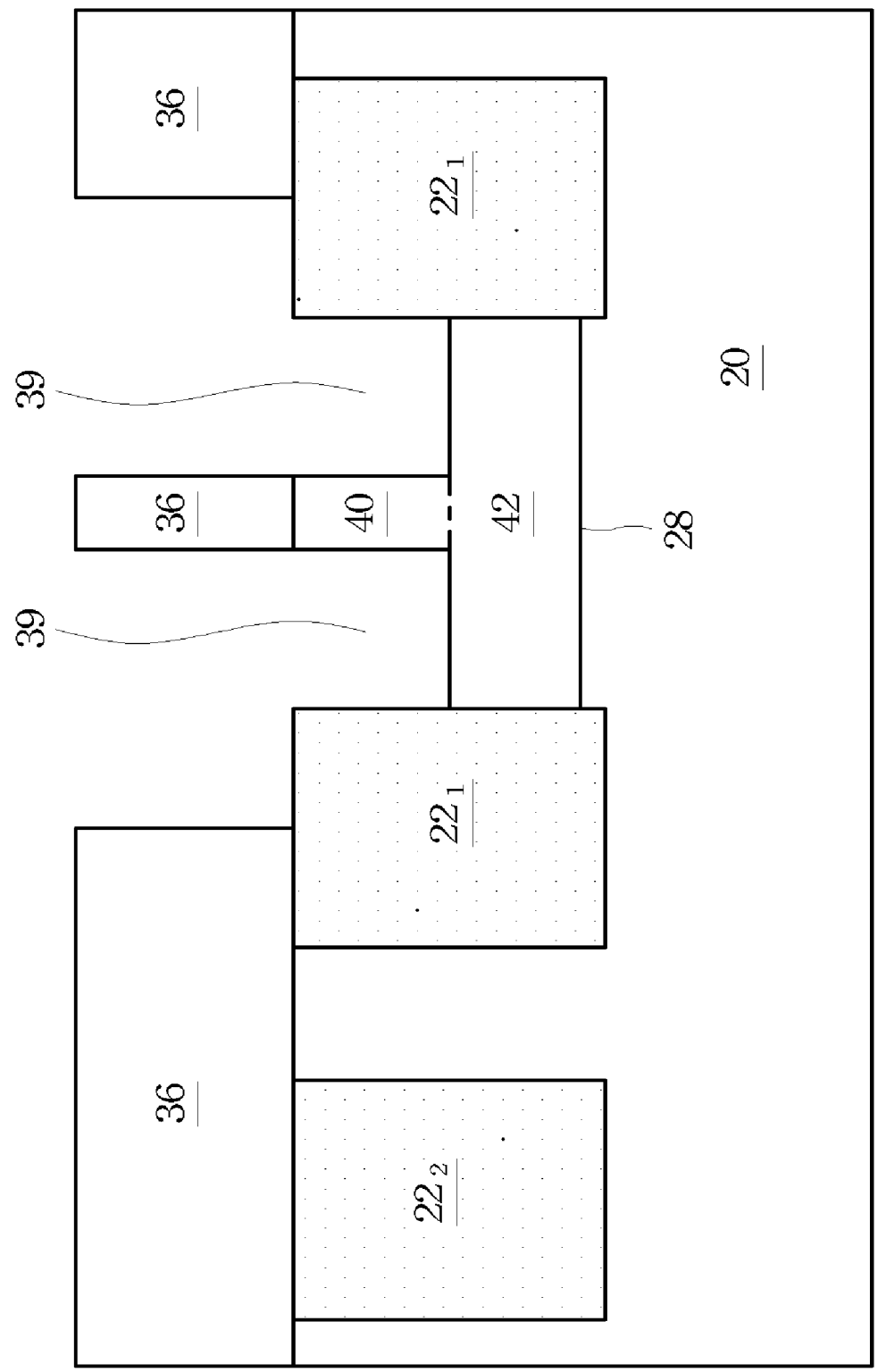
Figure 10:
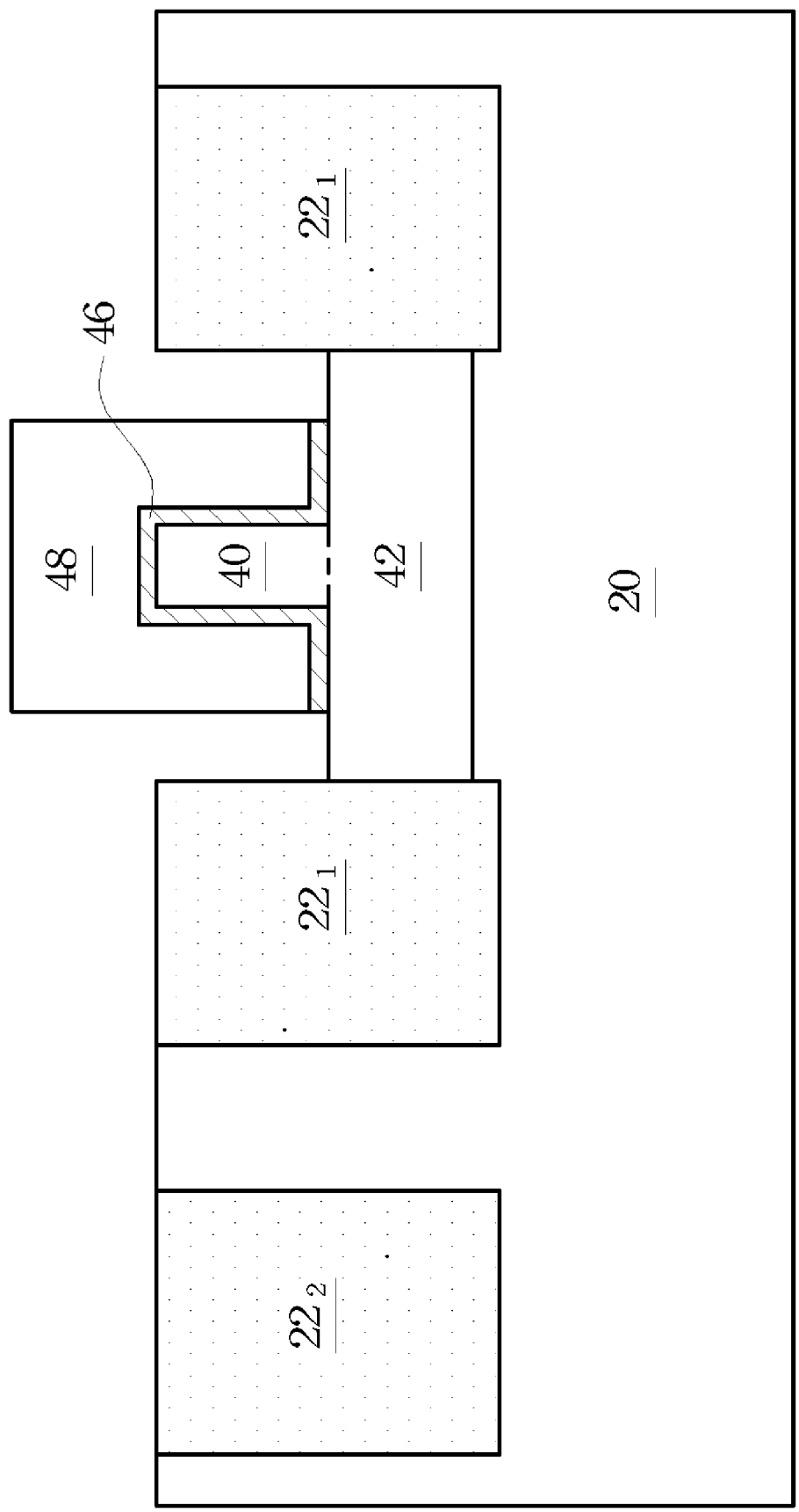

In alternative embodiments, after the formation of the structure as shown in FIG. 4, instead of etching both STI regions $22_1$ and germanium-containing region 32, only germanium-containing region 32 but not STI regions 22, is etched, as shown in FIG. 9. The depth of resulting recesses 39 may be higher than the interface between lower portion $32_1$ and higher portion $32_2$ (not shown), so that fin 40 is formed of substantially pure germanium, although it can be at any position above bottom surface 28 of germanium-containing region 32. As is known in the art, by forming the fin of the FinFET using substantially pure germanium, the electron mobility and hole mobility may be improved, resulting in a high drive current. Next, as shown in FIG. 10, hard masks 36 are removed, and gate dielectric 46 and gate electrode 48 may be formed.

Figure 11:
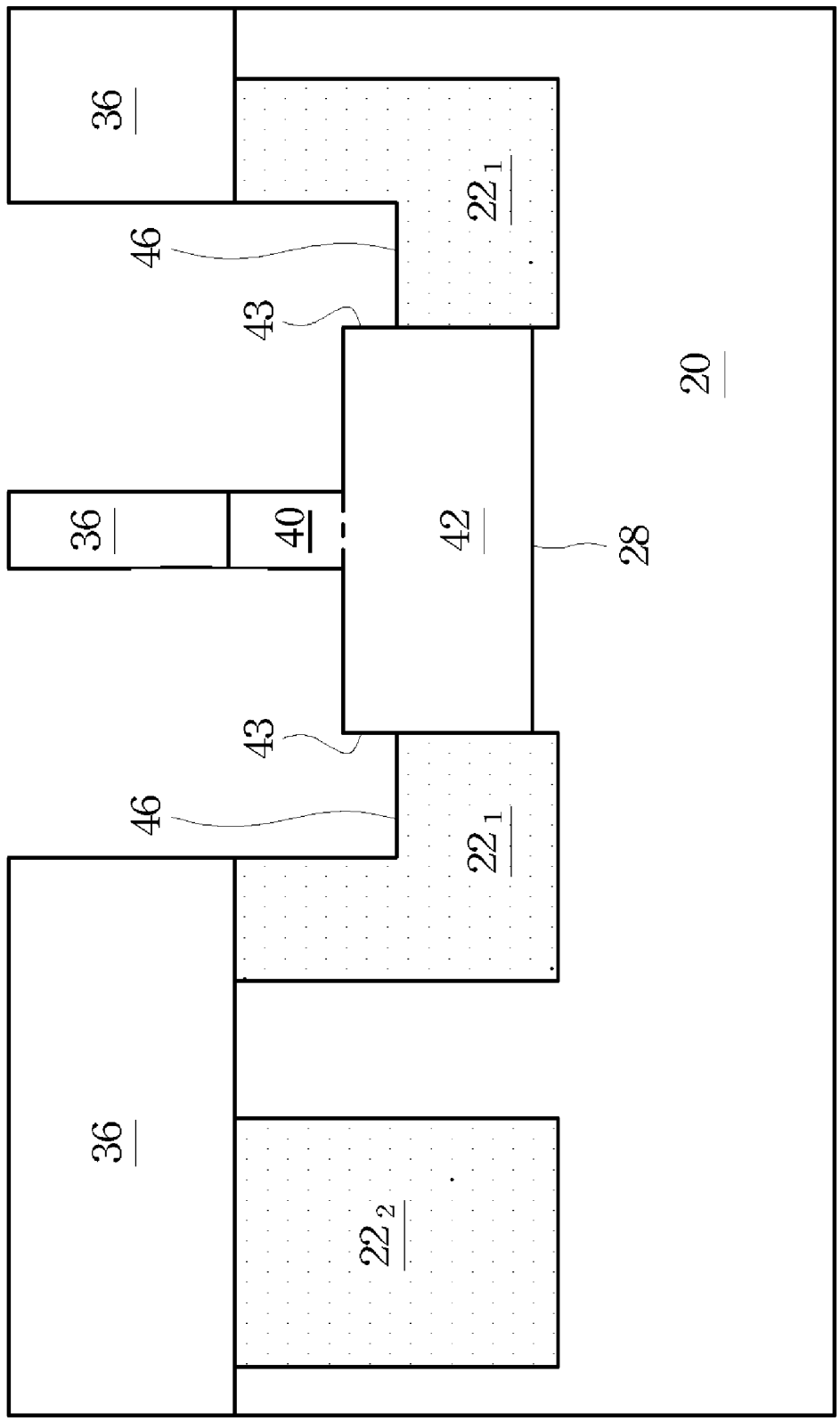
Figure 12:
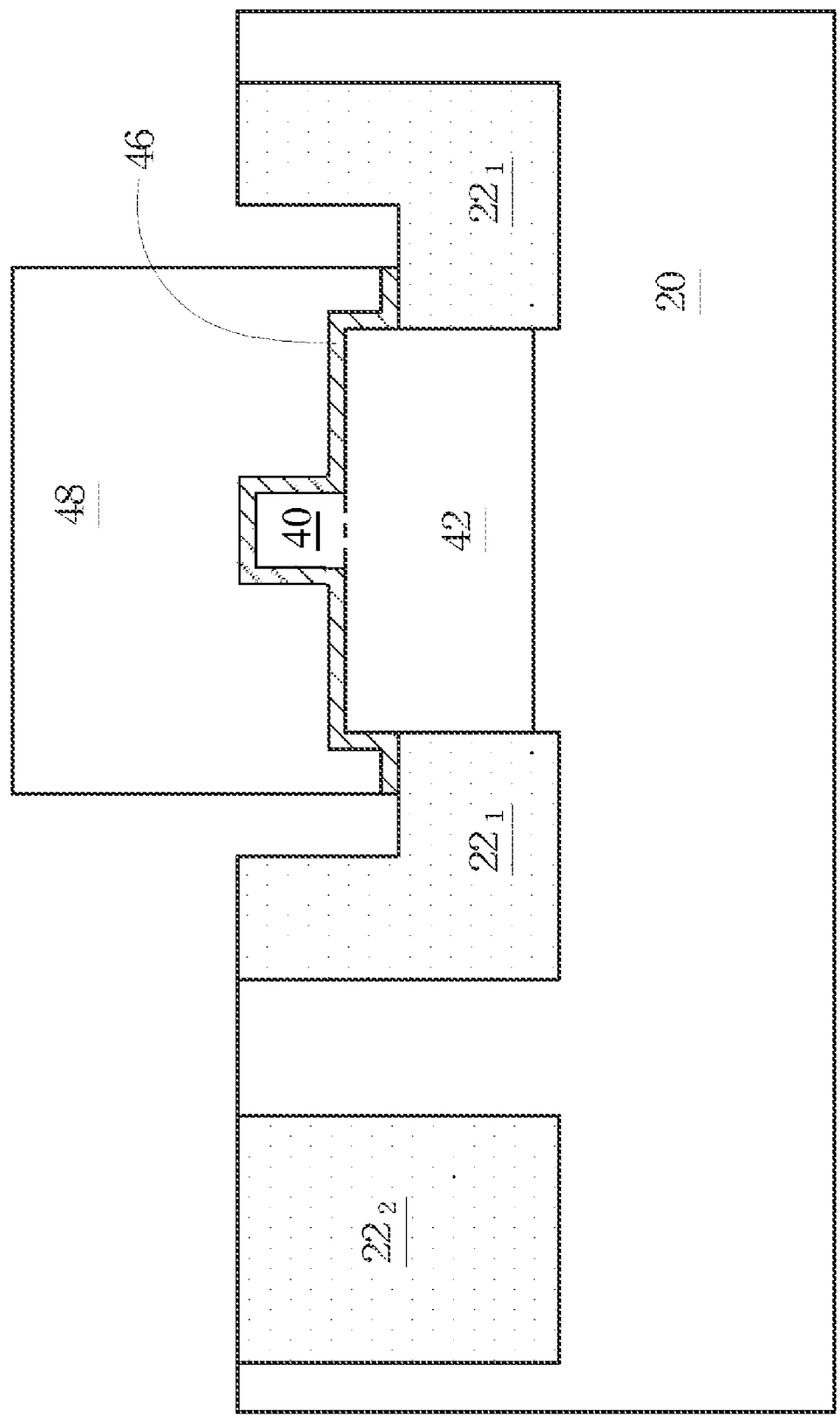

FIGS. 11 and 12 illustrate an alternative embodiment of the present invention. The initial structure of this embodiment is essentially the same as shown in FIG. 9, in which germanium-containing layer 32 is etched, while STI regions 22 are not etched. Next, as shown in FIG. 11, an etch, for example, a dry etch, is performed to recess at least portions of the top surface of STI regions $22_1$ to a level lower than the top surface of horizontal plate 42. Accordingly, portions of sidewalls 43 of horizontal plate 42 are exposed. In an embodiment, the top surfaces 47 of recessed STI regions $22_1$ are higher than bottom surfaces 28 of horizontal plate 42, so that the interface region between horizontal plate 42 and the underlying substrate 20 are not exposed. Accordingly, in the resulting multi-gate FET, the interface region, which is likely to have a high dislocation concentration, will not act as a portion of the channel region.

In FIG. 12, hard masks 36 are removed, and remaining portions of a multi-gate FET, including gate dielectric 46 and gate electrode 48, are formed.

In the above-discussed embodiments, germanium-containing materials are used as examples of the high-mobility materials. The teaching provided by the embodiments of the present invention, however, is readily applicable for forming other high-mobility semiconductor materials such as group III/group V compound semiconductor materials (known as III-V compound semiconductor materials) such as gallium nitride. Accordingly, the resulting multi-gate FETs as shown in FIGS. 8, 10 and 12 may include III-V compound semiconductor fins as channels.

The embodiments of the present invention have several advantageous features. With germanium-containing regions epitaxially grown between STI regions, thick germaniums with high germanium concentrations can be formed without causing the increase in the dislocation concentration. FinFET devices can thus be formed. Further, by forming reverse T-shaped germanium-containing regions, the FinFET may be started from STI regions having relaxed pitches, and there is no need to tightly locate STI regions together to suit the requirement of FinFETs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment and the combinations of various claims and embodiments are within the scope of the invention.

What is claimed is:

1. An integrated circuit structure comprising:
   a semiconductor substrate;
   a first insulation region and a second insulation region in the semiconductor substrate; and
   an epitaxial region having a reversed T-shape and comprising:
   a horizontal plate between and adjoining the first insulation region and the second insulation region, wherein a bottom of the horizontal plate contacts and is lattice aligned to the semiconductor substrate, and wherein the bottom is no lower than a bottom surface of the first insulation region; and
   a fin over and adjoining the horizontal plate;
   a gate dielectric on a top surface and at least top portions of sidewalls of the fin; and
   a gate electrode over the gate dielectric.

2. The integrated circuit structure of claim 1, wherein the semiconductor substrate comprisies substanially pure silicon, and the epitaxial region comprises germanium.

3. The integrated circuit structure of claim 1, wherein the horizontal plate comprises silicon germanium, and wherein a top portion the fin is formed of substantially pure germanium.

4. The integrated circuit structure of claim 1, wherein the horizontal plate comprises a superlattice structure comprising a plurality of germanium layers and a plurality of silicon germanium layers stacked in an alternating pattern.

5. The integrated circuit structure of claim 1, wherein top surfaces of the first insulation region and the second insulation region comprise first portions level with a top surface of the horizontal plate.

6. The integrated circuit structure of claim 5 further comprising a third insulation region in the semiconductor substrate and separated from the first insulation region and the second insulation region, wherein the third insulation region comprises a bottom surface substantially level with a bottom surface of the first insulation region and a top surface higher than the top surface of the horizontal plate.

7. The integrated circuit structure of claim 5, wherein the top surfaces of the first insulation region and the second insulation region further comprise second portions higher than the first portions, and wherein the second portions are farther away from the horizontal plate than the first portions.

8. The integrated circuit structure of claim 5 further comprising a dielectric layer over the horizontal plate, the first insulation region, and the second insulation region, wherein a top portion of the fin is not covered by the dielectric layer.

9. The integrated circuit structure of claim 1, wherein a top surface of the fin is substantially level with portions of top surfaces of the first insulation region and the second insulation region, and wherein a top surface of the horizontal plate is lower than the portions of the top surfaces of the first insulation region and the second insulation region.

10. The integrated circuit structure of claim 9, wherein the top surfaces of the first insulation region and the second insulation region further comprise second portions higher than the first portions.

11. The integrated circuit structure of claim 1, wherein first portions of top surfaces of the first insulation region and the second insulation region are lower than a top surface of the horizontal plate, and higher than a bottom surface of the horizontal plate.

12. The integrated circuit structure of claim 11, wherein the top surfaces of the first insulation region and the second insulation region further comprise second portions higher than the first portions.

13. An integrated circuit structure comprising:
    a semiconductor substrate;
    a first shallow trench isolation (STI) region and a second STI region in the semiconductor substrate;
    a germanium-containing region having a reversed T-shape and comprising:
    a horizontal plate between and adjoining the first STI region and the second STI region, wherein a bottom of the horizontal plate contacts and is lattice aligned to the semiconductor substrate and is no lower than a bottom surface of the first STI region; and
    a fin over and adjoining the horizontal plate;
    a gate dielectric on a top surface and top portions of sidewalls of the fin; and
    a gate electrode over the gate dielectric.

14. The integrated circuit structure of claim 13 further comprising a dielectric layer covering the horizontal plate and interjacent the gate dielectric and the horizontal plate.

15. The integrated circuit structure of claim 13, wherein the horizontal plate comprises silicon germanium, and wherein a top portion of the fin is formed of substantially pure germanium.

16. The integrated circuit structure of claim 13, wherein the horizontal plate comprises a superlattice structure comprising alternating germanium layers and silicon germanium layers, and wherein a top portion of the fin is formed of substantially pure germanium.

17. The integrated circuit structure of claim 13, wherein top surfaces of the first STI region and the second STI region are level with a top surface of the horizontal plate, and wherein the integrated circuit structure further comprises a third STI region having a top surface substantially level with a top surface of the fin.

18. The integrated circuit structure of claim 13, wherein top surfaces of the first STI region and the second STI region comprise portions lower than a top surface of the horizontal plate and higher than a bottom surface of the horizontal plate.

19. The integrated circuit structure of claim 18 further comprising a third STI region having a top surface higher than the top surface of the horizontal plate.

* * * * *